United States Patent
Luo et al.

(10) Patent No.: US 11,099,430 B2
(45) Date of Patent: Aug. 24, 2021

(54) DISPLAY AND A BACKLIGHT MODULE AND A LIGHT SOURCE HOLDER THEREOF

(71) Applicant: Wistron Corporation, New Taipei (TW)

(72) Inventors: Bin Luo, New Taipei (TW); Chih-Chou Chou, New Taipei (TW); Wei-Chia Huang, New Taipei (TW); Zhi-Yi Liang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/730,557

(22) Filed: Dec. 30, 2019

(65) Prior Publication Data
US 2021/0063820 A1 Mar. 4, 2021

(30) Foreign Application Priority Data
Sep. 3, 2019 (CN) .......................... 201910827990.9

(51) Int. Cl.
*G02F 1/13357* (2006.01)
*F21V 8/00* (2006.01)
*F21V 19/00* (2006.01)

(52) U.S. Cl.
CPC ...... *G02F 1/133608* (2013.01); *F21V 19/001* (2013.01); *G02B 6/0013* (2013.01); *G02F 1/133603* (2013.01)

(58) Field of Classification Search
CPC ......... G02F 1/133608; G02F 1/133603; G02B 6/0013; G02B 6/009; G02B 6/0083; F21V 19/001; H01L 33/62
See application file for complete search history.

(56) References Cited

U.S. PATENT DOCUMENTS

| 10,062,817 B1* | 8/2018 | Sudradjat | ................ H01L 33/60 |
| 2006/0193121 A1* | 8/2006 | Kamoshita | ............ H01L 33/508 362/84 |
| 2007/0153545 A1* | 7/2007 | Lee | ................... G02F 1/133615 362/610 |

(Continued)

FOREIGN PATENT DOCUMENTS

| CN | 201502961 U | * | 6/2010 |
| CN | 202008090 U | | 10/2011 |

(Continued)

OTHER PUBLICATIONS

Machine English Translation of CN202008090U, Huang (Year: 2011).*

(Continued)

*Primary Examiner* — Rajarshi Chakraborty
*Assistant Examiner* — Glenn D Zimmerman
(74) *Attorney, Agent, or Firm* — Donald E. Stout; Stout, Uxa & Buyan, LLP

(57) ABSTRACT

A backlight module includes a light guide panel and a backlight source, which emits light entering the light guide panel via a light receiving surface on a side of the light guide panel. The backlight source includes a base plate and a plurality of light source holders disposed on the base plate. The light source holder includes a circuit substrate having an opening and a base surface. The base surface and the opening are transitionally connected by a curved surface.

11 Claims, 7 Drawing Sheets

(56) References Cited

U.S. PATENT DOCUMENTS

| | | | | |
|---|---|---|---|---|
| 2011/0108871 | A1* | 5/2011 | Chen | H01L 33/60 |
| | | | | 257/98 |
| 2013/0201690 | A1* | 8/2013 | Vissenberg | F21V 9/08 |
| | | | | 362/296.07 |
| 2013/0328078 | A1* | 12/2013 | Wu | H01L 33/58 |
| | | | | 257/98 |
| 2014/0001504 | A1* | 1/2014 | Lin | H01L 33/52 |
| | | | | 257/98 |
| 2014/0138732 | A1* | 5/2014 | Sasaki | H05K 3/3431 |
| | | | | 257/99 |
| 2017/0114217 | A1* | 4/2017 | Kabashima | G02B 5/08 |
| 2017/0141273 | A1* | 5/2017 | Ichikawa | H01L 33/486 |
| 2017/0227177 | A1* | 8/2017 | Power | F21K 9/68 |
| 2019/0088825 | A1* | 3/2019 | Ichikawa | B29C 45/14655 |
| 2019/0363227 | A1* | 11/2019 | Luo | H01L 33/502 |
| 2020/0105978 | A1* | 4/2020 | Sakamoto | H01L 33/56 |

FOREIGN PATENT DOCUMENTS

| | | | |
|---|---|---|---|
| CN | 203190317 U | | 9/2013 |
| CN | 203466217 U | * | 3/2014 |
| CN | 204558522 U | | 8/2015 |
| JP | 20200053604 | * | 4/2020 |
| TW | I408458 B | | 9/2013 |
| TW | I460503 B | | 11/2014 |

OTHER PUBLICATIONS

Machine English Translation of CN203466217U, Lin (Year: 2014).*
Machine English Translation of CN201502961U, Tang (Year: 2010).*
Machine English Translation of JP2020053604A, Sakamoto (Year: 2020).*
Office Action dated Nov. 19, 2020 in corresponding Taiwan Patent Application No. 108133842.

* cited by examiner

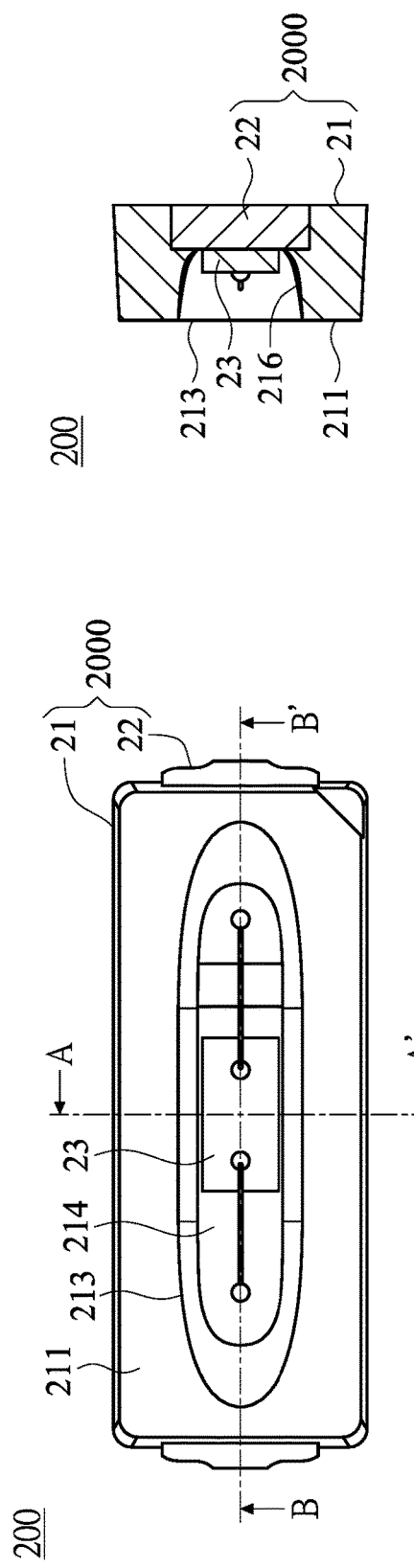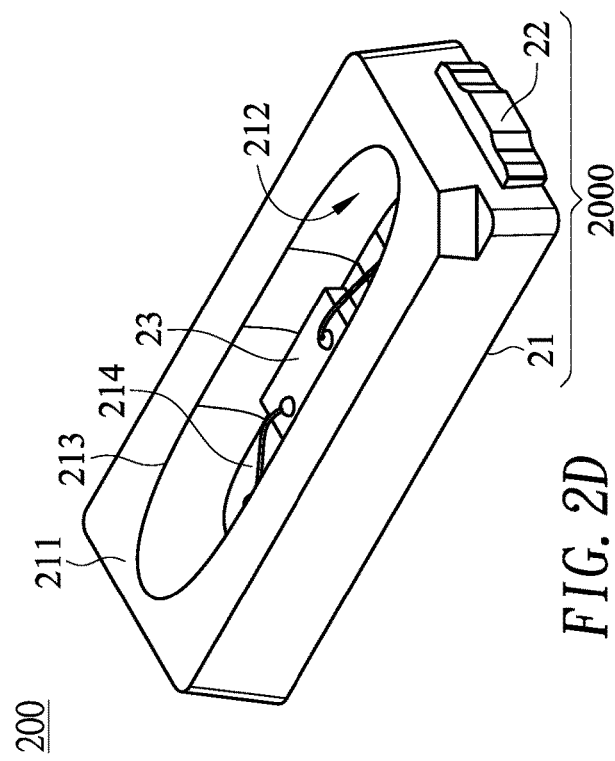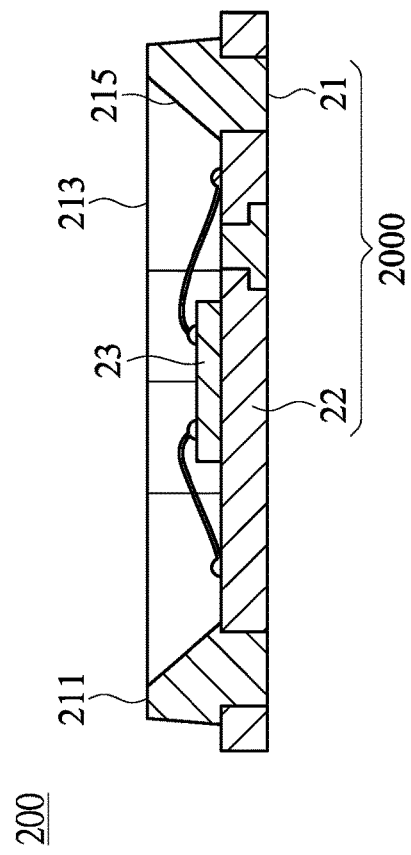
FIG. 2A
FIG. 2B
FIG. 2C
FIG. 2D

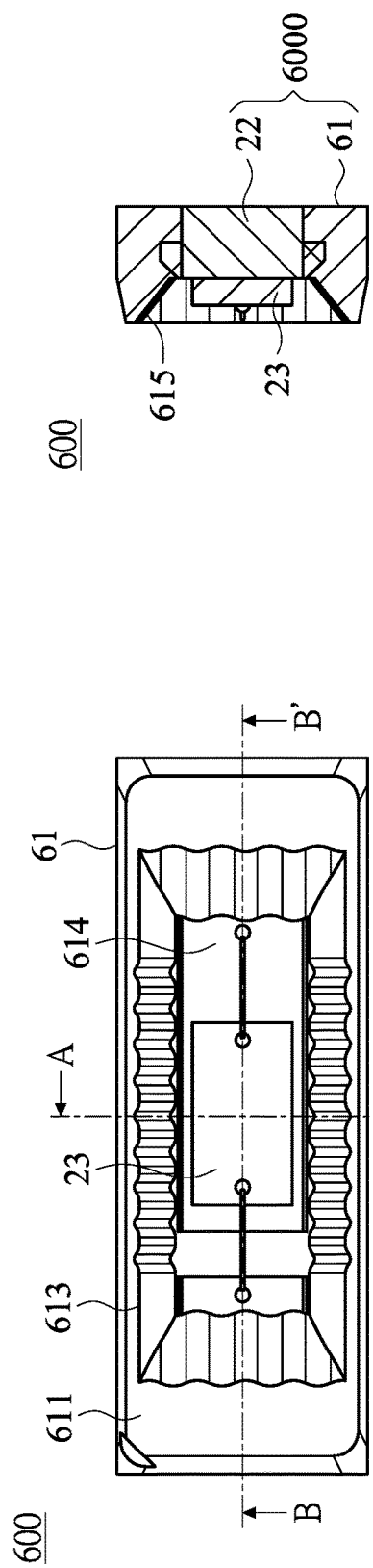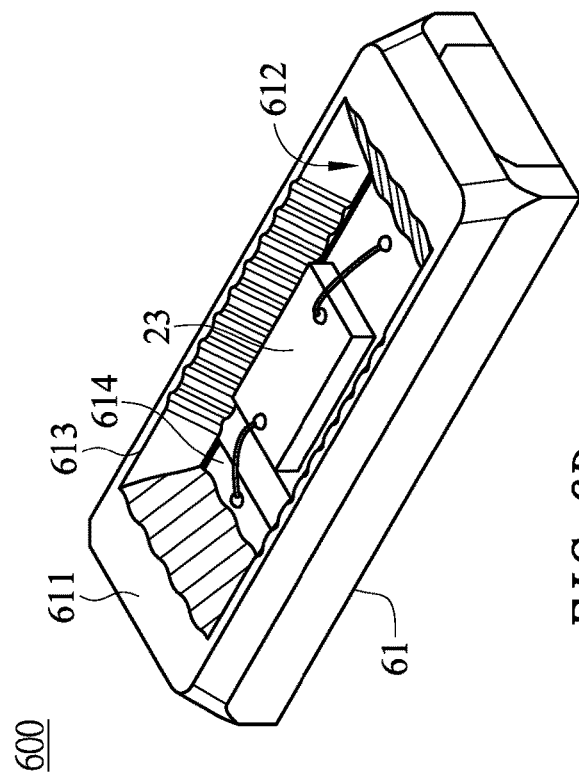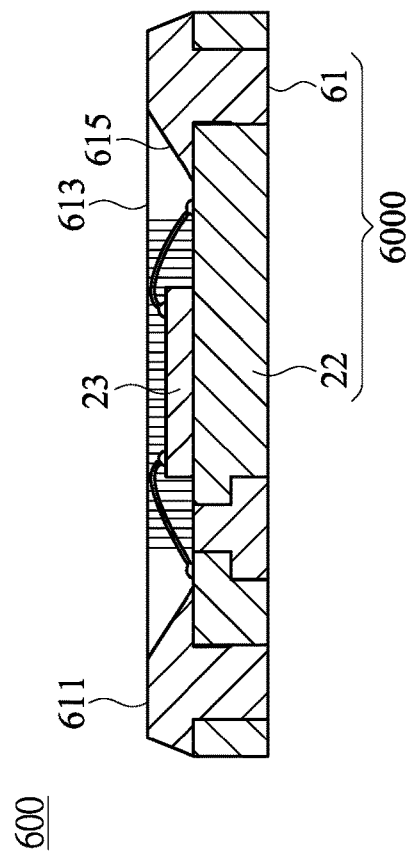
FIG. 6A
FIG. 6B
FIG. 6C
FIG. 6D

DISPLAY AND A BACKLIGHT MODULE AND A LIGHT SOURCE HOLDER THEREOF

CROSS-REFERENCE TO RELATED APPLICATIONS

This application claims priority of China Patent Application No. 201910827990.9, filed on Sep. 3, 2019, the entire contents of which are hereby incorporated by reference.

BACKGROUND OF THE INVENTION

1. Field of the Invention

The present disclosure generally relates to a display, and more particularly to a light source holder adaptable to a backlight module of a display.

2. Description of Related Art

A liquid crystal display does not emit light directly but use a backlight module that provides illumination to produce clear images. The light source (e.g., light-emitting diode or LED) of the backlight module may be disposed at the edge of the display panel (to result in an edge-lit backlight) or disposed at the back of the display panel (to result in a back-lit backlight).

In a conventional edge-lit backlight module, the light source in companion with a thin (e.g., about 0.8-1.5 mm) light guide panel may produce light leakage or hotspot. Increasing width of the light guide panel or amount of LEDs may improve these phenomena but at a higher cost.

A need has thus arisen to propose a novel scheme for improving the conventional edge-lit backlight module.

SUMMARY OF THE INVENTION

In view of the foregoing, it is an object of the embodiment of the present disclosure to provide a light source holder adaptable to a backlight module of a display for effectively reducing light leakage, hotspot or cost.

According to one embodiment, a backlight module includes a light guide panel and a backlight source, which emits light entering the light guide panel via a light receiving surface on a side of the light guide panel. The backlight source includes a base plate and a plurality of light source holders disposed on the base plate. The light source holder includes a circuit substrate having an opening and a base surface. The base surface and the opening are transitionally connected by a curved surface.

BRIEF DESCRIPTION OF THE DRAWINGS

FIG. 2A to FIG. 2D respectively show a top view, a right cross-sectional view, a front cross-sectional view and a perspective view illustrating a light source holder according to a first embodiment of the present disclosure;

FIG. 6A to FIG. 6D respectively show a top view, a right cross-sectional view, a front cross-sectional view and a perspective view illustrating a light source holder according to a second embodiment of the present disclosure.

DETAILED DESCRIPTION OF THE INVENTION

Figure 1A:
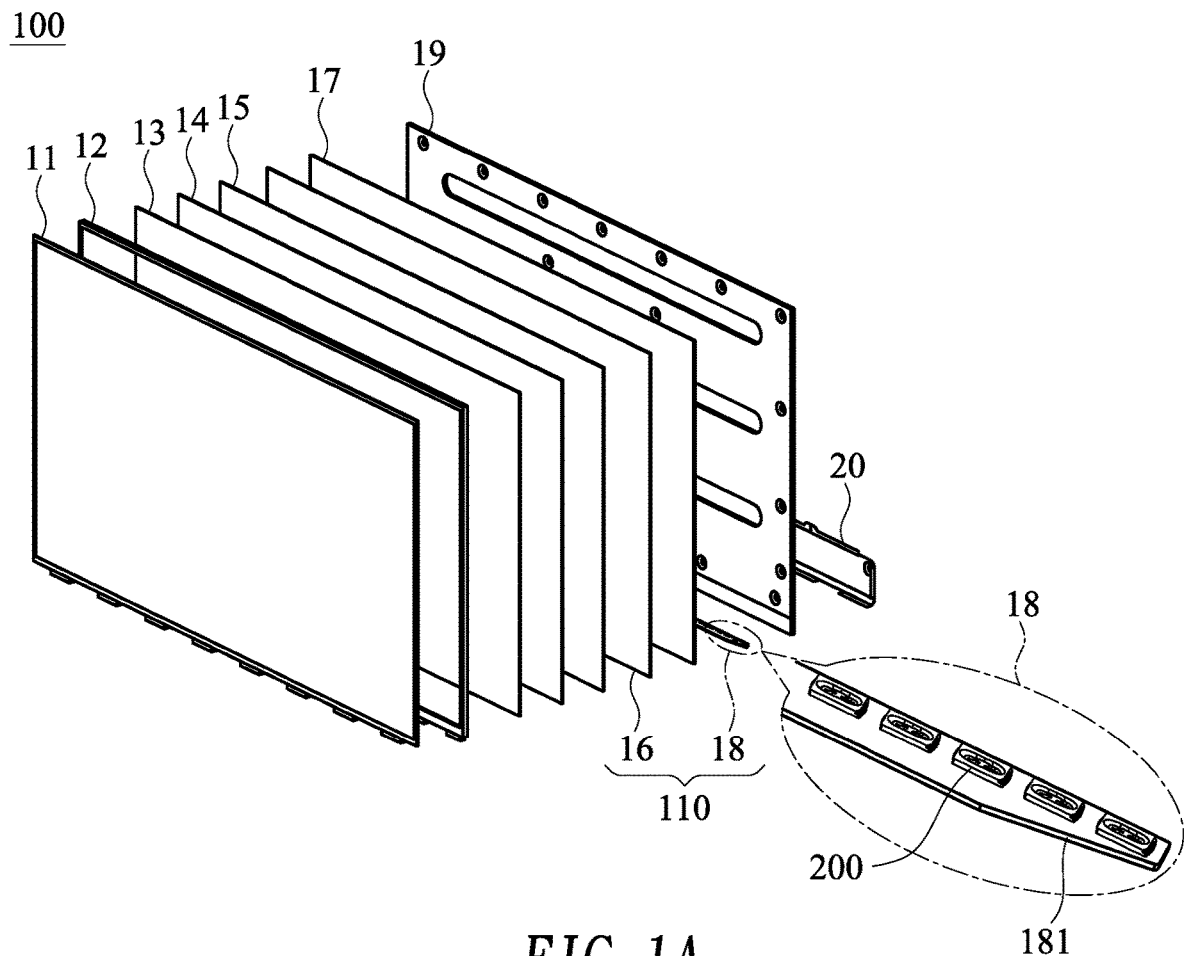
FIG. 1A shows a perspective exploded view illustrating a display according to one embodiment of the present disclosure.
Figure 1B:
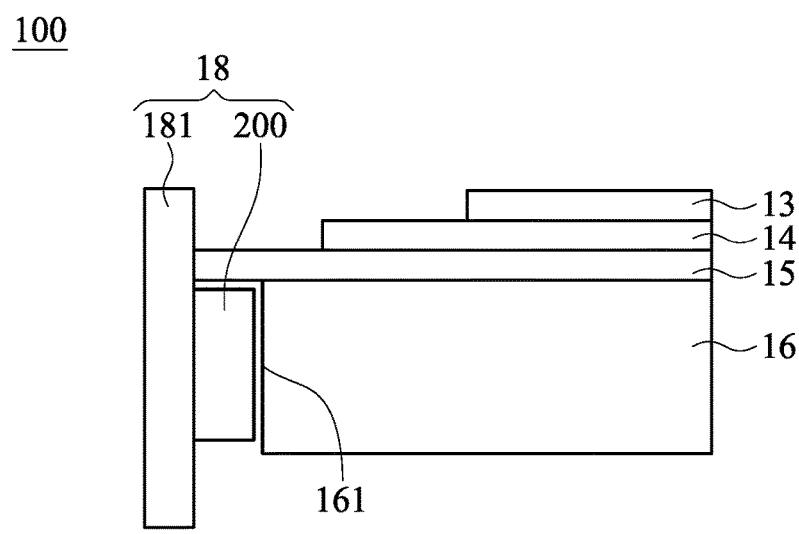
FIG. 1B shows a partial side view illustrating the display of FIG. 1A.

FIG. 1A shows a perspective exploded view illustrating a display 100 according to one embodiment of the present disclosure, and FIG. 1B shows a partial side view illustrating the display 100 of FIG. 1A. In the embodiment, the display 100 (e.g., liquid crystal display) may include, from the display side to the inside, a display panel 11, a middle frame 12, a top diffuser 13, a prism 14, a bottom diffuser 15, a light guide panel (LGP) 16, a reflector 17, a backlight source 18, a back chassis 19 and a shielding cover 20. The light guide panel 16 and the backlight source 18 may construct a backlight module 110. The backlight source 18 may include a base plate 181 and a plurality of light source holders 200 disposed on the base plate 181. The light source holder 200 may include a light source (e.g., light-emitting diode (LED)), which emits light entering the light guide panel 16 via a light receiving surface 161 on a side of the light guide panel 16, therefore providing backlight for the display panel 11. The light guide panel may ordinarily include a transparent material. In one embodiment, the light guide panel 16 may include glass, and a gap between the light receiving surface 161 (of the light guide panel 16) and the light source holder 200 may not be required. In another embodiment, the light guide panel 16 may include plastic, and a gap between the light receiving surface 161 (of the light guide panel 16) and the light source holder 200 may be required to cope with thermally expanded light guide panel 16.

FIG. 2A to FIG. 2D respectively show a top view, a right cross-sectional view (along a section line A-A° in a lateral direction), a front cross-sectional view (along a section line B-B° in a longitudinal direction) and a perspective view illustrating a light source holder 200 according to a first embodiment of the present disclosure. In the embodiment, the light source holder 200 may include a circuit substrate 2000, which may be mainly composed of a main part 21 and a copper electroplated substrate 22. Specifically, the main part 21 (e.g., with the shape of a rectangular parallelepiped) may have a top surface 211. The main part 21 of the embodiment may include a milky-white material such as Polycyclohexylenedimethylene Terephthalate/glass fiber (PCT/GF). The main part 21 may have a recess 212, and an intersection of the recess 212 and the top surface 211 (of the main part 21) may define an opening 213.

Figure 2E:
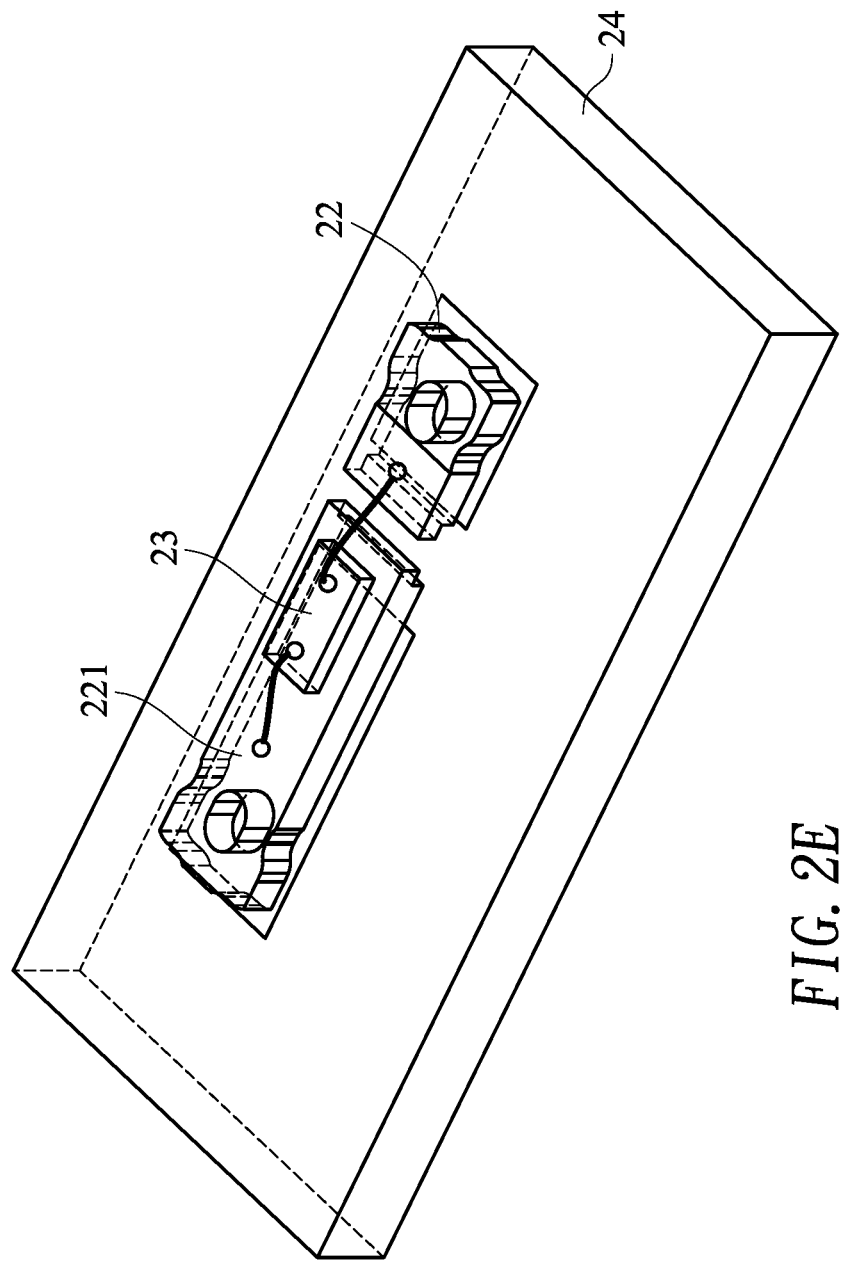
FIG. 2E shows a perspective view illustrating the copper electroplated substrate.
Figure 3B:
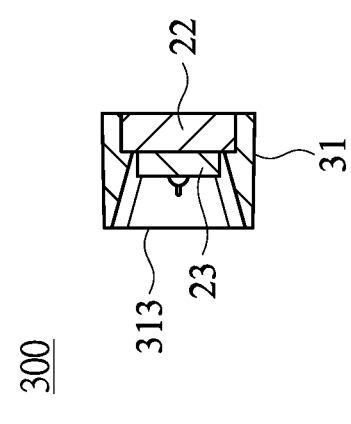
FIG. 3A to FIG. 3D respectively show a top view, a right cross-sectional view, a front cross-sectional view and a perspective view illustrating a light source holder adaptable to a backlight module.
Figure 3D:
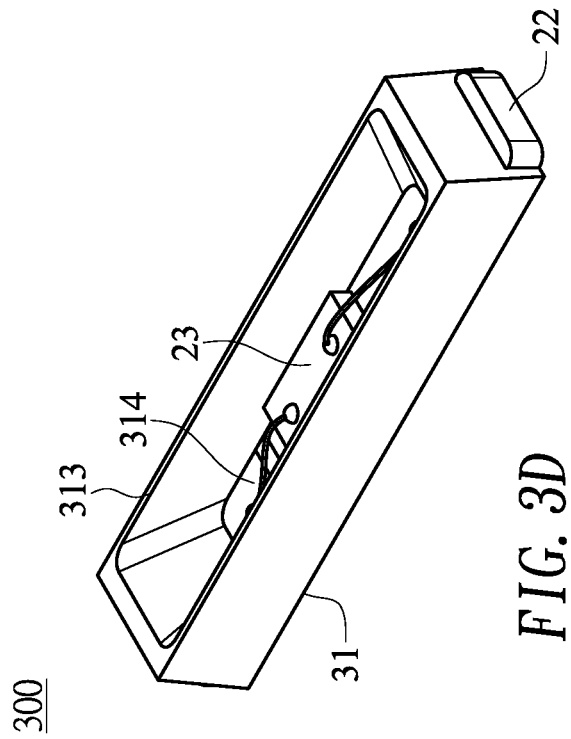
Figure 3A:
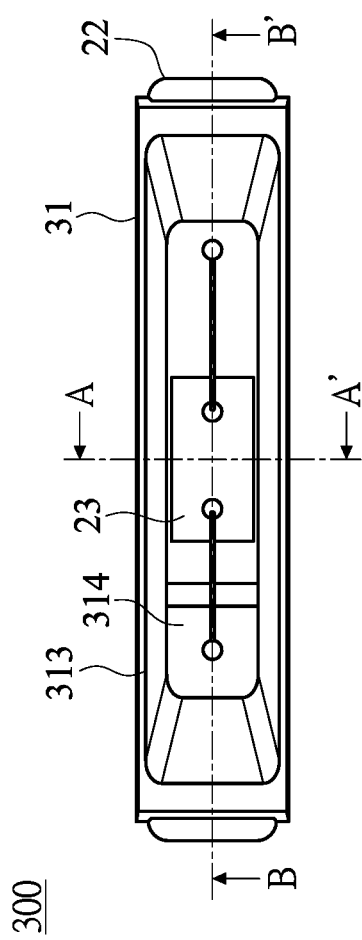
Figure 3C:
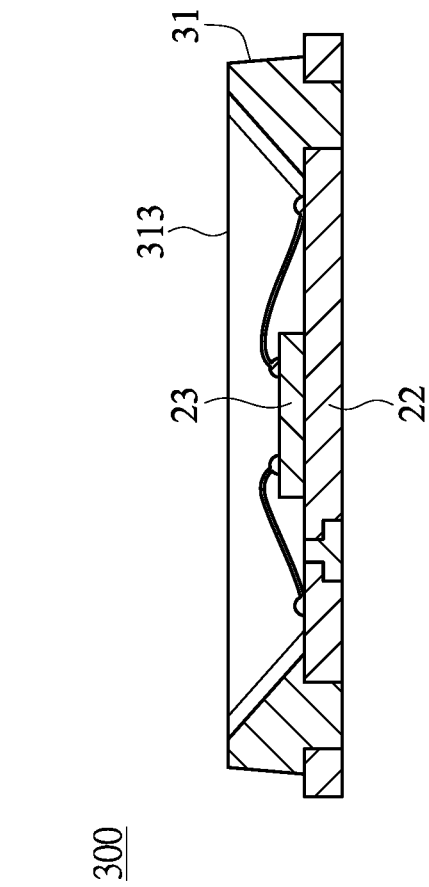

The copper electroplated substrate 22 of the embodiment may be disposed at a bottom of the main part 21 for supporting at least one light source 23 (e.g., light-emitting diode (LED)). FIG. 2E shows a perspective view illustrating the copper electroplated substrate 22 disposed on a circuit board 24 and with the light source 23 disposed thereon. An intersection of the recess 212 (of the main part 21) and a top surface 221 of the copper electroplated substrate 22 may define a base surface 214. The opening 213 and the base surface 214 of the embodiment may be semi-elliptical, which has a straight line on each side along a longitudinal direction and has a spline on each side along a lateral direction. In the embodiment, the opening 213 may have a size greater than the base surface 214. In one embodiment, an area ratio of the opening 213 to the base surface 214 may be 1.77-1.88.

In the embodiment, the base surface 214 and the opening 213 may be transitionally connected by a curved surface. According to one aspect of the embodiment, the base surface 214 and the opening 213 may be transitionally connected by a curved line 216 on a side along a longitudinal direction in the main part 21, and the curved line 216 may slant outwards (i.e., away from an internal center of the main part 21) from bottom to top as shown in FIG. 2B. The center of curvature of the curved line 216 may be located to the side of the recess 212 of the main part 21.

In the embodiment, the base surface 214 and the opening 213 may be transitionally connected by a straight line 215 on a side along a lateral direction in the main part 21, and the straight line 215 may slant outwards (i.e., away from an internal center of the main part 21) from bottom to top as shown in FIG. 2C. In one embodiment, an angle formed by the straight line 215 and the base surface 214 may be 130.8°-132.4°.

FIG. 3A to FIG. 3D respectively show a top view, a right cross-sectional view (along a section line A-A° in a lateral direction), a front cross-sectional view (along a section line B-B° in a longitudinal direction) and a perspective view illustrating a light source holder 300 adaptable to a backlight module. A primary difference between the light source holder 300 and the light source holder 200 of the embodiment is that a base surface 314 and an opening 313 (of a main part 31) of the light source holder 300 are transitionally connected by a flat surface instead of the curved surface as in the light source holder 200 of the embodiment. Technical effects of the light source holder 200 of the embodiment as compared to the light source holder 300 of FIGS. 3A-3D will be described in details as follows.

Figure 4A:
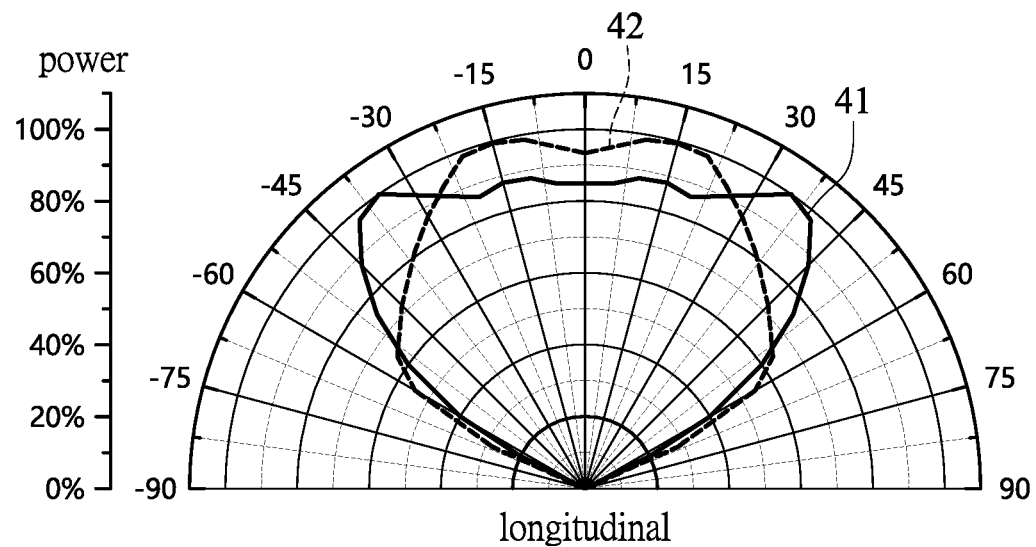
FIG. 4A shows angles of illumination along a longitudinal direction.
Figure 4B:
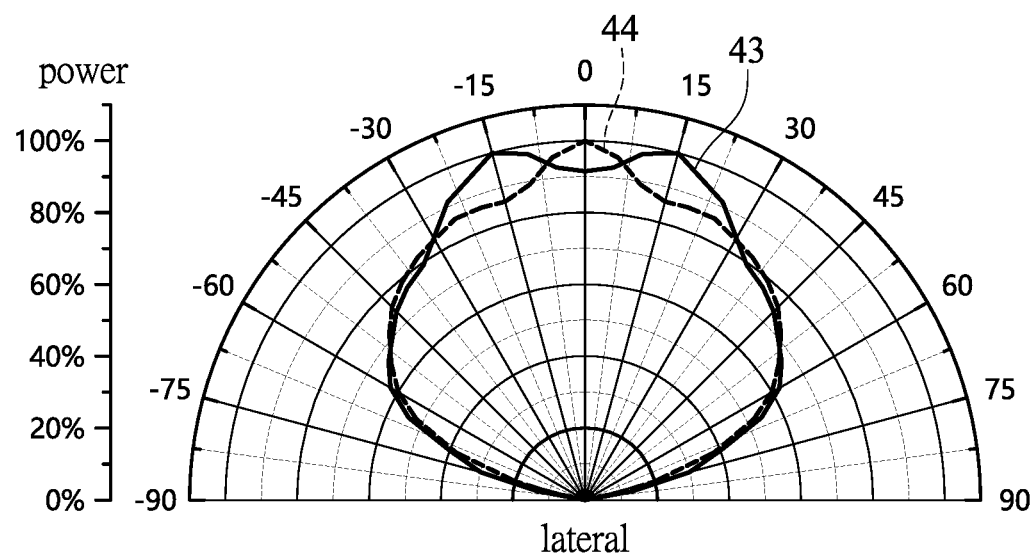
FIG. 4B shows angles of illumination along a lateral direction.

FIG. 4A shows angles of illumination along a longitudinal direction, where the numeral 41 represents an angle of the light source holder 300 (of FIGS. 3A-3D) having an average value of 114° at half (50%) power, and the numeral 42 represents an angle of the light source holder 200 of the embodiment (of FIGS. 2A-2D) having an average value of 128° at half (50%) power, which is greater than the average angle of illumination of the light source holder 300 (of FIGS. 3A-3D), thereby facilitating light divergence along the longitudinal direction. FIG. 4B shows angles of illumination along a lateral direction, where the numeral 43 represents an angle of the light source holder 300 (of FIGS. 3A-3D) having an average value of 130°, and the numeral 44 represents an angle of the light source holder 200 of the embodiment (of FIGS. 2A-2D) having an average value of 128°, which is less than the average angle of illumination of the light source holder 300 (of FIGS. 3A-3D) at half (50%) power, thereby facilitating light convergence along the lateral direction.

As a curved line 216 transitionally connects on a side along a longitudinal direction in the main part 21, a light distribution curve may be changed and light leakage on edge may be substantially reduced. Accordingly, average luminance entering the light receiving surface 161 of the light guide panel 16 may be increased with amount of 13.39%. Moreover, regarding light leakage measurement above the light receiving surface 161 of the light guide panel 16, the embodiment is better than the light source holder 300 (of FIGS. 3A-3D). Accordingly, the effect of assembly tolerance with respect to brightness and light leakage between the light source holder 200 and the light guide panel 16 may be alleviated.

Figure 5A:
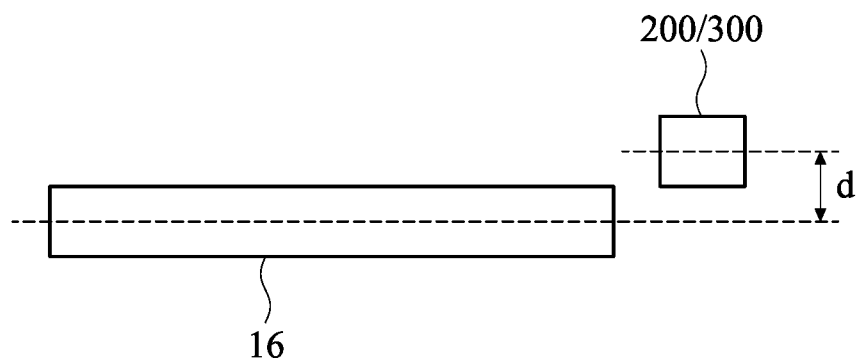
FIG. 5A shows a side view illustrating the light guide panel and the light source holder.
Figure 5B:
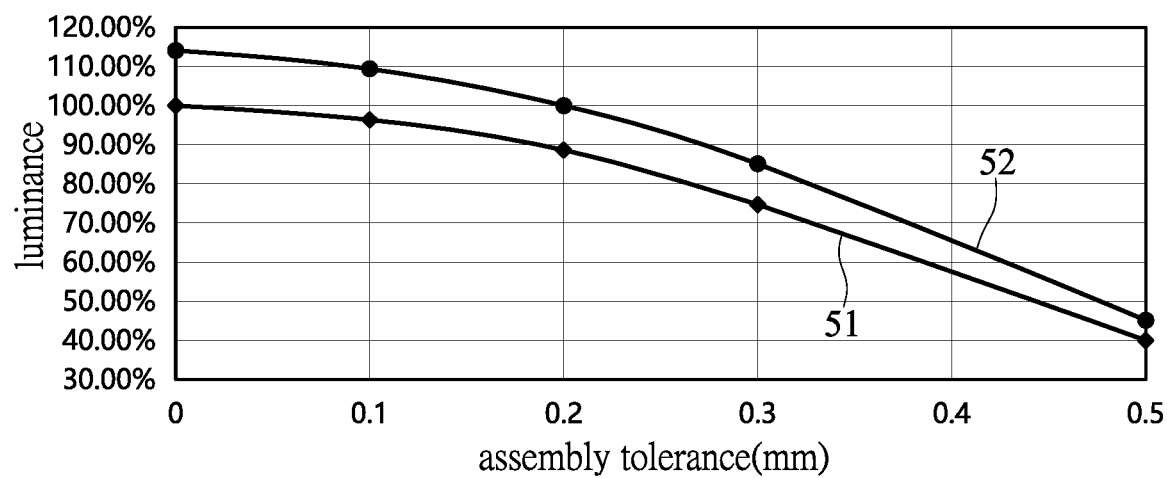
FIG. 5B shows relation curves between average luminance entering the light guide panel and assembly tolerance.

FIG. 5A shows a side view illustrating the light guide panel 16 and the light source holder 200/300 with assembly tolerance d. FIG. 5B shows relation curves between average luminance entering the light guide panel 16 and assembly tolerance, where the numeral 51 represents a relation curve of the light source holder 300 (of FIGS. 3A-3D), and the numeral 52 represents a relation curve of the light source holder 200 of the embodiment (of FIGS. 2A-2D). As evident from FIG. 5B, the light source holder 200 of the embodiment may endure more assembly tolerance when the luminance is fixed; or the light source holder 200 of the embodiment may have more luminance when the assembly tolerance is fixed.

Regarding the light source holder 300 of FIGS. 3A-3D, light entering the light receiving surface 161 of the light guide panel 16 between two light source holders 300 may generate dark zone (or hotspot) with a size of 4.38 mm$^2$, while dark zone caused by the light source holder 200 of the embodiment has a size of only 3.36 mm$^2$. Accordingly, compared to the light source holder 300 of FIGS. 3A-3D, interval between two light sources may be increased to reduce the amount of light sources in the embodiment without scarifying performance.

As a curved line 216 transitionally connects on a side along a longitudinal direction in the main part 21, the main part 21 may be designed with a thicker wall, thereby substantially increasing structural strength. Regarding shift and deformation measurement on the light source holder 200 under loading, the loading may be increased with amount of 28.69% as compared to the light source holder 300 of FIGS. 3A-3D.

Moreover, as the base surface 214 and the opening 213 of the light source holder 200 of the embodiment may be transitionally connected by a curved surface instead of a flat surface as in the light source holder 300 (of FIGS. 3A-3D), heat dissipation capability of the light source holder 200 of the embodiment may be increased with amount of 8.84% as compared to the light source holder 300.

FIG. 6A to FIG. 6D respectively show a top view, a right cross-sectional view (along a section line A-A° in a lateral direction), a front cross-sectional view (along a section line B-B° in a longitudinal direction) and a perspective view illustrating a light source holder 600 according to a second embodiment of the present disclosure. In the embodiment, the light source holder 600 may include a circuit substrate 6000, which may be mainly composed of a main part 61 and a copper electroplated substrate 22. Specifically, the main part 61 may have a top surface 611. The main part 61 may have a recess 612, and an intersection of the recess 612 and the top surface 611 (of the main part 61) may define an opening 613.

The copper electroplated substrate 22 of the embodiment may be disposed at a bottom of the main part 61 for supporting at least one light source 23 (e.g., light-emitting diode (LED)). An intersection of the recess 612 (of the main part 61) and a top surface 221 of the copper electroplated substrate 22 may define a base surface 614. The opening 613 and the base surface 614 of the embodiment may be rectangular.

According to one aspect of the embodiment, the base surface 614 and the opening 613 may be transitionally connected by a wave surface. Further, the base surface 614 and the opening 613 may be transitionally connected by a straight line 615, which may slant outwards (i.e., away from an internal center of the main part 61) from bottom to top as shown in FIGS. 6B-6C. Other aspects of the light source holder 600 of the embodiment are similar to the light source holder 200 of the previous embodiment (of FIGS. 2A-2D), details of which are omitted for brevity.

Although specific embodiments have been illustrated and described, it will be appreciated by those skilled in the art that various modifications may be made without departing from the scope of the present disclosure, which is intended to be limited solely by the appended claims.

What is claimed is:

1. A light source holder, comprising:
   a circuit substrate having an opening and a base surface;
   wherein the light source holder effectively reduces light leakage, and the base surface and the opening are transitionally connected by a wave surface on an inner surface of the circuit substrate, an inner side of the wave surface having a cross section of a straight line connected between the base surface and the opening.

2. The holder of claim 1, wherein the circuit substrate comprises:
   a main part having a top surface and a recess, an intersection of the recess and the top surface defining the opening; and
   a copper electroplated substrate disposed at a bottom of the main part for supporting at least one light source, an intersection of the recess and a top surface of the copper electroplated substrate defining the base surface.

3. The holder of claim 1, wherein the opening has a size greater than the base surface.

4. The holder of claim 1, wherein the base surface and the opening are transitionally connected by a straight line, which slants outwards from bottom to top.

5. The holder of claim 2, wherein the main part comprises Polycyclohexylenedimethylene Terephthalate/glass fiber (PCT/GF).

6. The holder of claim 3, wherein an area ratio of the opening to the base surface is 1.77-1.88.

7. A backlight module, comprising:
   a light guide panel; and
   a backlight source, which emits light entering the light guide panel via a light receiving surface on a side of the light guide panel, the backlight source including a base plate and a plurality of light source holders disposed on the base plate;
   wherein the light source holder includes:
   a circuit substrate having an opening and a base surface;
   wherein the light source holder effectively reduces light leakage, and the base surface and the opening are transitionally connected by a wave surface on an inner surface of the circuit substrate, an inner side of the wave surface having a cross section of a straight line connected between the base surface and the opening.

8. The module of claim 7, wherein the circuit substrate comprises:
   a main part having a top surface and a recess, an intersection of the recess and the top surface defining the opening; and
   a copper electroplated substrate disposed at a bottom of the main part for supporting at least one light source, an intersection of the recess and a top surface of the copper electroplated substrate defining the base surface.

9. The module of claim 8, wherein the light source comprises a light-emitting diode.

10. A display, comprising:
    a display panel;
    a light guide panel; and
    a backlight source, which emits light entering the light guide panel via a light receiving surface on a side of the light guide panel for providing backlight for the display panel, the backlight source including a base plate and a plurality of light source holders disposed on the base plate;
    wherein the light source holder includes:
    a circuit substrate having an opening and a base surface;
    wherein the light source holder effectively reduces light leakage, and the base surface and the opening are transitionally connected by a wave surface on an inner surface of the circuit substrate, an inner side of the wave surface having a cross section of a straight line connected between the base surface and the opening.

11. The display of claim 10, wherein the circuit substrate comprises:
    a main part having a top surface and a recess, an intersection of the recess and the top surface defining the opening; and
    a copper electroplated substrate disposed at a bottom of the main part for supporting at least one light source, an intersection of the recess and a top surface of the copper electroplated substrate defining the base surface.

* * * * *